United States Patent [19]

Little

[11] 4,219,740

[45] Aug. 26, 1980

[54] PROXIMITY SENSING SYSTEM AND INDUCTANCE MEASURING TECHNIQUE

[75] Inventor: William R. Little, Seattle, Wash.

[73] Assignee: Eldec Corporation, Lynnwood, Wash.

[21] Appl. No.: 2,968

[22] Filed: Jan. 12, 1979

[51] Int. Cl.² .............................................. G01R 27/26
[52] U.S. Cl. ................................... 307/116; 340/686; 324/59
[58] Field of Search ........................ 324/59, 327, 328; 340/686, 572; 307/116

[56] References Cited

U.S. PATENT DOCUMENTS

| 3,454,869 | 7/1969 | Strauss et al. | 323/75.5 |
| 3,469,204 | 10/1969 | Magyar | 307/116 X |
| 3,514,627 | 5/1970 | Bridgeman | 340/686 X |

FOREIGN PATENT DOCUMENTS 320785  1/1972  U.S.S.R. .................................... 324/59

Primary Examiner—L. T. Hix
Assistant Examiner—James L. Dwyer
Attorney, Agent, or Firm—Christensen, O'Connor, Johnson & Kindness

[57] ABSTRACT

A proximity sensing system including an improved variable inductance measuring technique to provide an indication of the proximity of a target object to a remote sensor unit 10 which includes a sensor inductor. A variable inductance measuring apparatus measures the inductance of the sensor inductor, which inductance corresponds to the proximity of a target object. The variable inductance measuring network includes a sensor current pulse generator 20 which, in each of successive system periods, establishes a time-varying current through the sensor unit 10. A sensor control loop stage 30 senses when the resulting sensor voltage reaches a predetermined level and then captures the sensor current so as to clamp the sensor voltage at this level. A retrieval stage 40 then determines the rate of change of the sensor current at the time the sensor current is zero, establishing a calibrated analog voltage of the inductance of the sensor inductor which is substantially temperature independent. The inductance analog voltage is applied to a proximity detection and switching stage 50 which provides a quantized target-near detection pulse if the inductance analog voltage corresponds to a threshold proximity of the target object. Integration over successive system periods then provides a time-average proximity voltage which is applied to a Schmitt trigger and proximity switching network 58, the output of which indicates the proximity of the target object to the sensor inductor with respect to a threshold actuation gap.

46 Claims, 5 Drawing Figures

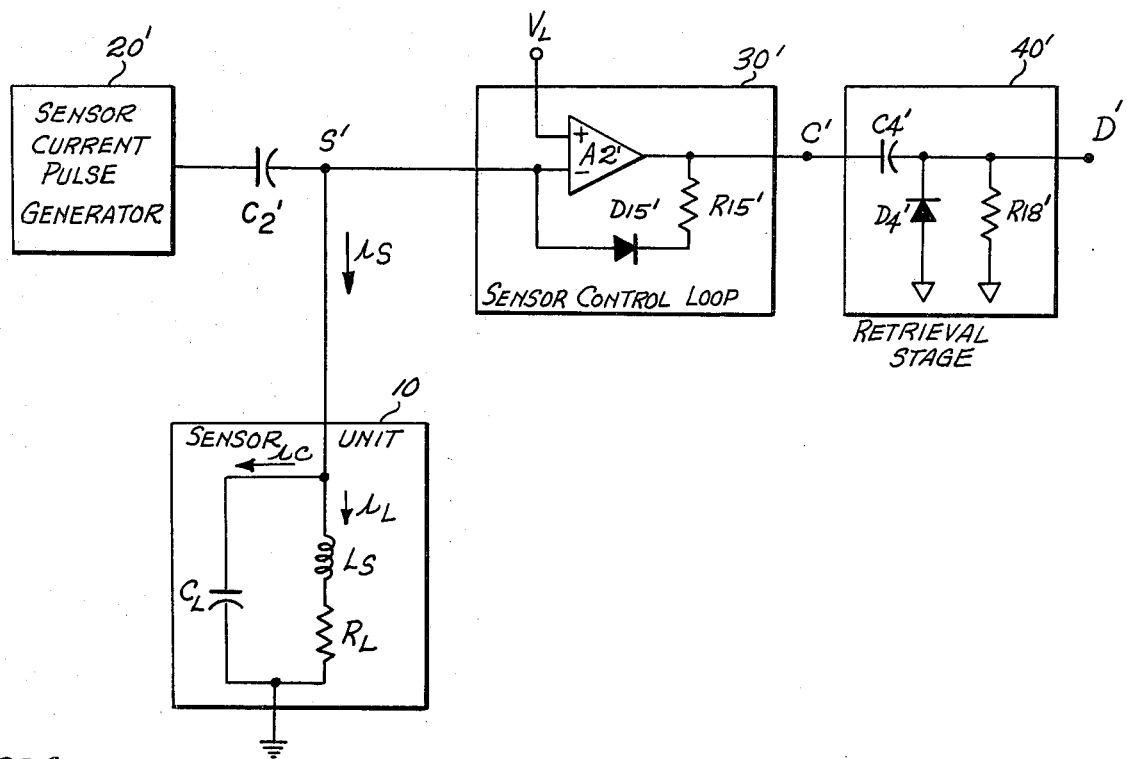
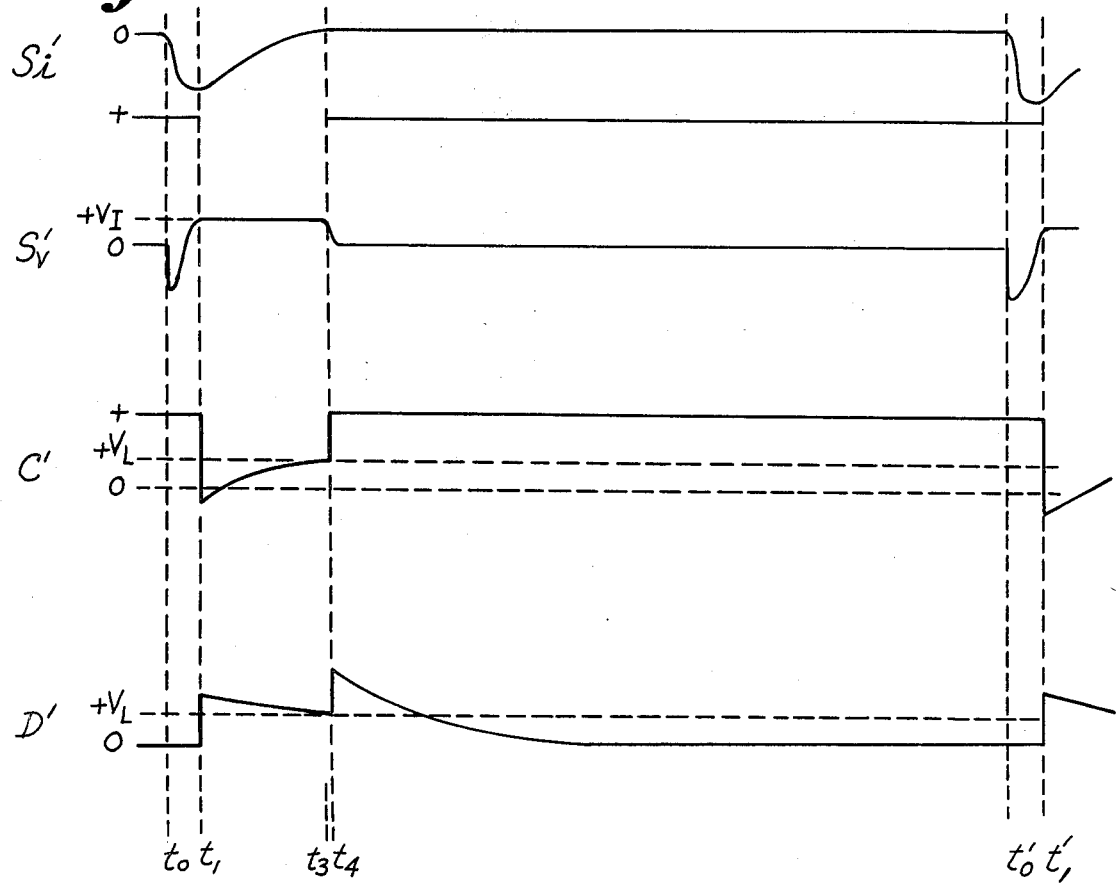

PROXIMITY SENSING SYSTEM AND INDUCTANCE MEASURING TECHNIQUE

BACKGROUND OF THE INVENTION

The present invention relates to inductance measuring apparatus, and more particularly to proximity sensing systems which utilize a variable inductance measuring apparatus to determine the inductance of a sensor inductor as a means of monitoring the proximity of a target object to a sensor unit.

Proximity switches, and the advantages thereof, as well known in the art. In many applications of switching electric current to a load, there are situations which require the positioning of a switch assembly in environmental conditions which render the reliable life of the switch assembly short and subject to uncertain operation. One example of an electric switch assembly which must operate under adverse conditions is presented by the aviation industry. On an airplane, numerous switch assemblies are subjected to extreme heat and extreme cold, high vibration and shock, as well as to chemicals, corrosive fluids and adverse moisture conditions. Conventional mechanical switches simply are not reliable under the extreme environmental conditions encountered in aircraft operation; and yet, in many applications on an aircraft it is essential to have a current control and switch assembly with remote operational capability which provides assured, reliable operation.

In such situations, proximity-type switches have proved to be able to reliably withstand extreme environmental conditions. Such a proximity-type switch typically comprises a so-called two-piece proximity sensing system which includes a sensor unit, including an inductor having a coil and a core, located at a remote site, and also includes electronic switching circuitry interconnected with the sensor unit by a cable and responsive to changes in the inductance of the sensor inductor. As is well known in the art, the inductance of the sensor inductor varies in accordance with variations of the reluctance of the magnetic path which includes the sensor inductor and a target object (e.g., part of a landing gear strut or a cargo door). By determining the inductance of the sensor inductor, the electronic switching circuitry can provide an indication of proximity of the target object to the sensor unit. It is also well known in the art that the sensor unit can be made physically robust in order to withstand the extremes of environment encountered in operation, with the more delicate electronic switching circuitry of the proximity sensing system being isolated from the environmental extremes at the site of the sensor unit.

The above notwithstanding, environmental and other conditions can still affect the accuracy of the inductance measurement, and consequently the reliability of the switching of the proximity sensing system. This is because the sensor unit is actually characterized by an equivalent circuit which includes, in addition to the inductance of the sensor inductor, an equivalent series resistance corresponding to the resistance of the inductor coil and the cable and an equivalent shunt capacitance due to the cable. Through the proper choice of core materials, the sensor unit can be fabricated so that its equivalent inductance is relatively temperature independent. The equivalent series resistance and shunt capacitance of the sensor unit, however, are temperature dependent causing an uncompensated inductance measurement to also be variable with temperature.

Also, it is desirable that the electronic switching circuits and sensor units of different proximity sensing systems be interchangeable, that is, any one electronic switching circuit can operate and maintain calibration when connected to any sensor unit and its associated cable of an arbitrary length. As a result of this interchangeability, the resistance in series with the sensor inductor and particularly, the capacitance in shunt with the sensor inductor can vary over a substantial range. Thus, it is desirable that no special adjustment or recalibration of a proximity sensing system be necessary when its electronic switching circuitry is interconnected with various sensor unit and cable assemblies.

In order to reduce the temperature dependence of two-piece proximity sensing systems, prior art devices of this type often incorporate a temperature compensation network into the sensor unit. An example of a temperature compensated sensor unit for a two-piece proximity switch appears in U.S. Pat. No. 3,454,869. Therein is disclosed a proximity sensing system which includes a Maxwell bridge, including an inductive leg and a plurality of resistive legs, and a synchronous detector which is responsive to changes in the inductance of the inductive leg of the bridge. The inductive leg and one of the resistive legs comprise the sensor unit. The resistive leg in the sensor unit is chosen to provide a degree of temperature compensation so as to reduce the temperature variability of the inductance measured by the proximity sensing system. While such a sensor unit provides a degree of temperature invariability, certain factors affecting the accuracy, as well as the reliability, of this type of proximity sensing system remain.

First of all, the incorporation into the sensor unit of a temperature compensation resistor does not insure the effective cancellation of temperature-dependent effects from the equivalent series resistance of the sensor unit over the wide temperature variations encountered in many applications (for instance, in the aviation industry). Also, since the temperature compensation resistor generally incorporates a wire-wound configuration utilizing relatively fine wire, it introduces a failure point which affects the reliability of the sensor unit. In addition, the use of a temperature compensation resistor requires three leads to the sensor unit, increasing the amount of cabling required to connect the remote sensor unit to the electronic switching circuitry of the proximity sensing system (an important consideration in areas, such as the aviation industry, where the cost, maintainability and weight of wiring are factors). Further, the three-wire requirement for sensor units incorporating a temperature compensation resistor introduces another failure point, an additional reliability factor which must be considered. And, of course, the use of a temperature compensation resistor incorporated into the sensor unit does not affect the temperature variability arising from the equivalent shunt capacitance of the sensor unit.

It is therefore a general object of the present invention to provide an improved inductance measuring technique which can be adapted for use in a proximity sensing system.

A further object of the present invention is to provide a proximity sensing system incorporating a variable inductance measuring apparatus capable of providing an accurate, temperature independent measure of the inductance of a sensor inductor despite the presence of equivalent series resistance and shunt capacitance which is variable with changes in temperature and in the length of the cable coupling the sensor inductor and the variable inductance measuring apparatus.

Another object of the present invention is to provide such a proximity sensing system incorporating a remote sensor unit comprising only a single circuit element, an inductor requiring only two leads, one of which is common or ground, thereby reducing wiring and connection requirements with attendant increases in economy, maintainability and reliability.

Still another object of the present invention is to provide a proximity sensing system incorporating a variable inductance measuring apparatus capable of measuring a variable inductance and thereby developing a target proximity indication with increased accuracy and reliability over devices currently available, and at a lower cost.

SUMMARY OF THE INVENTION

Accordingly, to accomplish these and other objects, the present invention provides a proximity sensing system and variable inductance measuring apparatus, which includes a remote sensor unit, to periodically monitor the proximity of a target object to the sensor unit. The sensor unit, while comprising only a sensor inductor (the inductance of which changes in relation to the proximity of a target object), is characterizable by an equivalent circuit which includes temperature dependent equivalent series resistance and equivalent shunt capacitance. During successive system periods, a sensor current pulse generator establishes a time-varying current through the sensor unit and the sensor inductor. When the voltage across the sensor unit reaches a predetermined reference level, a sensor control loop stage controls the current through the sensor unit so as to constrain the sensor voltage constant at the reference level. A retrieval stage then determines the rate of change of the sensor current when the sensor current goes through zero and provides an inductance analog voltage representative of the inductance of the sensor inductor. Finally, a proximity detection and switching stage of the proximity sensing system outputs a target-near indication when the inductance of the sensor inductor indicates that the proximity of the target object to the sensor unit corresponds to a threshold actuation gap.

The sensor control loop stage comprises a comparator and a transistor feedback loop responsive to the voltage across the sensor unit. When the sensor voltage reaches the predetermined reference voltage, the transistor feedback loop captures the sensor current, sinking sufficient current to hold the sensor voltage constant at this reference voltage (thereby cancelling the effect of the equivalent shunt capacitance of the sensor unit on the determination of the inductance of the sensor inductor).

While the voltage across the sensor unit is constant, the retrieval network differentiates a voltage proportionate to the sensor current. The rate of change of this proportionate voltage is then determined at the time when the sensor current is passing through zero (thereby cancelling the effect of the equivalent series resistance of the sensor unit on the inductance determination), to establish the inductance analog voltage corresponding to the inductance of the sensor inductor and, thereby, to the proximity of the target object.

The proximity detection and switching stage of the proximity sensing system develops a quantized target-near detection pulse when the inductance of the sensor inductor corresponds to a distance between the target object and the sensor unit which is equal to or less than a threshold actuation gap. Successive quantized target-near detection pulses are integrated to obtain a time-average proximity voltage which is applied to a Schmitt trigger. The output of the Schmitt trigger is representative of the proximity of the target object to the sensor unit.

BRIEF DESCRIPTION OF THE DRAWINGS

The novel features believed to be characteristic of the present invention are set forth in particularity in the appended claims. However, a more complete appreciation of the present invention, both as to organization and mode of operation, and the attendant advantages thereof will result as the same becomes better understood by reference to the following detailed description of the preferred embodiment when considered in conjunction with the accompanying drawings, wherein:

FIG. 1 is a functional block and circuit diagram depicting the variable inductance measuring technique according to the present invention;

FIG. 2 provides a timing diagram with illustrative waveforms $S_i'$, $S_v'$, C' and D' which are associated with corresponding points of the diagram in FIG. 1;

DESCRIPTION OF THE PREFERRED EMBODIMENT

Figure 3:
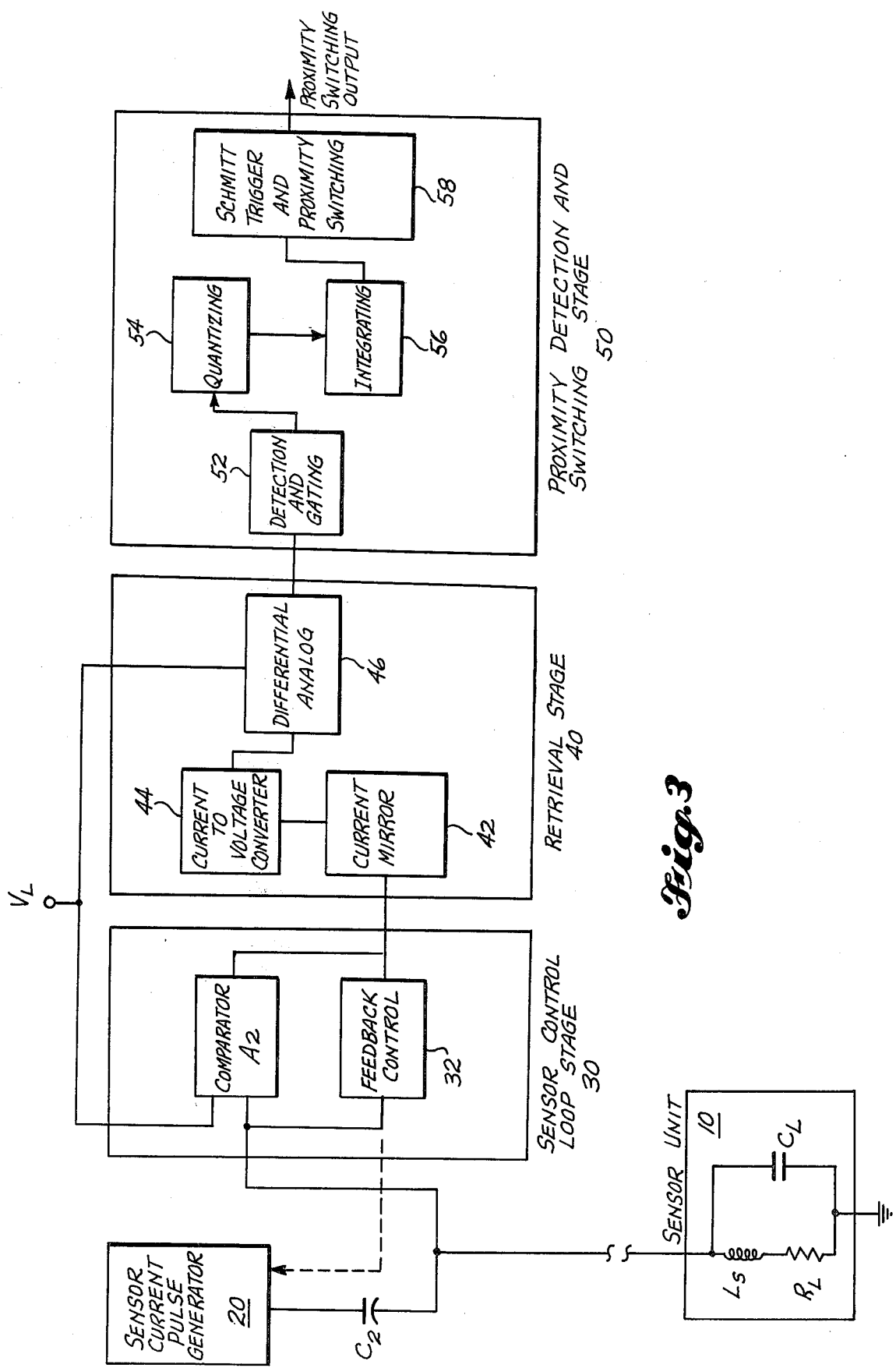
FIG. 3 is a functional block diagram of a preferred embodiment of the proximity sensing system and variable inductance measuring apparatus.

In a preferred embodiment, a novel inductance measuring apparatus is adapted for use in a two-piece proximity sensing system which includes electronic switching circuitry and a sensor unit, comprised of a sensor inductor, which can be at a location remote from the electronic switching circuitry.

The sensor unit for use with the proximity sensing system of the present invention can be durably fabricated in a manner known to the prior art. The sensor unit includes a sensor inductor which comprises a coil which may be wound on a magnetically permeable core. Through the proper construction and choice of the core materials, the equivalent inductance of the sensor inductor can be made relatively independent of temperature. The sensor inductor is conventionally enclosed within a durable and robust sensor unit housing. The sensor unit is then disposed at a remote sensing site and connected to the electronic switching circuitry of the proximity sensing system by means of a cable containing a pair of wires, one of which is common.

As employed in the proximity sensing system of the preferred embodiment, the variable inductance measuring apparatus provides a calibrated indication of the inductance of the sensor inductor, which inductance is a function of the proximity of a target object to the sensor unit. Of course, the manner in which the inductance of the sensor inductor changes with respect to the proximity of a target object depends on the material of which the target object is comprised. In general, it may be said that a target object composed of a magnetic material will cause an increase in the inductance of the sensor inductor as it is brought near the sensor unit, while the use of a nonmagnetic but conductive metallic material will result in a decrease in the inductance of the sensor inductor with increasing proximity. With minor modifications to the inductance measuring apparatus of the present invention, readily implemented by those skilled in the art, the proximity sensing system of the present invention can readily accommodate both types of target objects. In the ensuing detailed description of the proximity sensing system, it is assumed that the target object is comprised of a magnetically permeable material and that, therefore, the inductance of the sensor inductor of the sensor unit increases as the target object is brought in closer proximity to the sensor unit.

Before commencing the detailed description of the preferred embodiment of the proximity sensing system, a discussion of the general concept involved in the variable inductance measuring technique of the present invention is germane. Referring to the functional block and circuit diagram in FIG. 1, a sensor unit is indicated generally at 10. As noted above, the sensor unit of the two-piece proximity sensing system of the preferred embodiment is comprised of a single circuit element, a sensor inductor. This notwithstanding, sensor unit 10 inherently and unavoidably includes some series resistance arising from the dc resistance of the sensor inductor and the series resistance due to cabling, together with an amount of shunt capacitance arising from the stray capacitance of the cable coupling the sensor unit to the electronic switching circuitry of the proximity sensing system. Thus, the sensor unit is actually characterized by the equivalent circuit shown at 10 and comprised of a sensor inductor with an equivalent inductance $L_S$ together with a series resistance $R_L$ and a shunt capacitance $C_L$.

Focusing attention on sensor unit 10 and its equivalent circuit, if a time-variable current $i_S$ is established through the sensor unit, circuit analysis yields the following expression of the time-variable voltage $v_S$ which appears across the sensor unit (circuit point S')

$$v_S = L_S \frac{di_L}{dt} + R_L i_L \quad (1)$$

where $$i_S = i_L + i_C \quad (2)$$

and $$i_C = C_L \frac{dv_S}{dt} \quad (3)$$

If sensor voltage $v_S$ is constrained in some manner to be a constant (i.e., $dv_S/dt$ is equal to zero), then, from equation 3, $i_C$ will be zero with the result that $i_L$ will be equal to $i_S$. The expression for the voltage across sensor unit 10 in equation 1 then reduces to $$v_S = V_L = L_S \frac{di_S}{dt} + R_L i_S \quad (4)$$

where $V_L$ is an arbitrary constant.

Rearranging equation 4, the inductance $L_S$ of the sensor inductor is given by the expression $$L_S = \frac{v_S - R_L i_S}{\frac{di_S}{dt}} \bigg| v_S = V_L \quad (5)$$

Note that a capacitive term does not appear in this expression, the effect of the capacitance $C_L$ having been cancelled by constraining the sensor voltage $v_S$ to be a constant. If a determination is made of $di_S/dt$ at the time when the sensor current $i_S$ is going through zero, the temperature dependent resistive term cancels out, and a determination of the inductance $L_S$ can be obtained according to $$L_S = \frac{V_L}{di_S/dt} \bigg| i_S = 0 \quad (6)$$

Accordingly, the inductance measuring method of the present invention involves: (a) establishing a time-varying current $i_S$ through the sensor unit 10; (b) controlling the sensor current $i_S$ so as to constrain the voltage $v_S$ to be constant when such voltage $v_S$ reaches an arbitrary constant value $V_L$; and, (c) determining the rate of change of current $i_S$, at a time when the current $i_S$ is passing through zero. In accordance with this method, the proximity sensing system and variable inductance measuring apparatus of the present invention cyclically develops a calibrated indication of the inductance $L_S$ in order to periodically ascertain the proximity of the target object to the sensor unit 10. Thus, during a particular system period $T_S$, the proximity sensing system implements the above indicated inductance measuring technique during a sensor charge period $T_C$ and a sensor data period $T_D$. The proximity sensing system is responsive to a calibrated inductance indication developed during the sensor data period $T_D$ to provide a target-near indication if and when the target object approaches the sensor unit 10 to a distance at or closer than a predetermined threshold actution gap.

A functional implementation of the above indicated variable inductance measuring technique of the present invention can be described with reference to FIGS. 1 and 2. For this purpose, the circuit implementation indicated in FIG. 1 utilizes circuit components assumed to be theoretically perfect. Accordingly, with respect to the current state of the art, the indicated functional circuit implementation is highly schematic. Also the ensuing discussion relates to a single system period $T_S$, with the variable inductance measuring technique being identical for successive system periods.

A sensor current pulse generator 20' charges a capacitor C2' to a voltage $V_I$ and then periodically switches the capacitor C2' across the sensor unit 10 to initiate the sensor charge period $T_C$ of a system period $T_S$ at time $t_0$. This establishes a damped sinusoidal current $i_S$ (as indicated by a waveform $S_i'$) through the sensor unit, with the resulting damped sinusoidal voltage $v_S$ across the sensor unit (circuit point S') being described by equation 1. Due to the polarity shown for capacitor C2', the voltage $v_S$ is initially $-V_I$, increasing thereafter through zero as indicated by waveform $S'_v$.

From above, the variable inductance measuring technique of the present invention is to control the time-varying sensor current $i_S$ so as to constrain the sensor voltage $v_S$ constant at a reference voltage $V_L$ (and, thereby, cancel the effect of the equivalent shunt capacitance on the determination of the sensor inductance $L_S$). Thus, in terms of a schematic circuit, when the voltage $v_S$ (circuit point S') rises to the reference voltage $V_L$ of a comparator A2' (at time $t_1$), the comparator slews its output negative as shown by waveform C'. The output of comparator A2' goes just sufficiently negative to permit a feedback loop comprised of a resistor R15' and a diode D15' to capture the current $i_S$ so as to maintain the voltage $v_S$ at the reference voltage $V_L$. (Also at time $t_1$, sensor current pulse generator 20' disconnects capacitor C2 from across sensor unit 10, thereby ending the sensor charge period $T_C$ and allowing the capacitor to again charge toward $V_I$.)

The time $t_1$ marks the beginning of the sensor data period $T_D$. After time $t_1$ the entire current in sensor unit 10 flows through the D15'/R15' feedback loop. Thus (assuming perfect components), the voltage at circuit point C' is $$v_C = i_S R15' \qquad (7)$$

This voltage $v_C$ is seen (waveform C') to be proportionate to the current $i_S$ and increases as the current $i_S$ (waveform $S_i$) gradually decreases toward zero.

During the sensor data period $T_D$, a retrieval stage 40' differentiates the proportionate voltage $v_C$ to determine the rate of change of the current $i_S$ and, in particular, the rate of change of the current $i_S$ when the current $i_S$ reaches zero. Thus, the proportionate voltage $v_C$ is differentiated by a capacitor C4' to form an analog voltage $v_D$ across a resistor R18 (circuit point D') which is related to the rate of change of the current $i_S$. (A diode D4' removes the accumulated charge from capacitor C4' after the end of the sensor data period $T_D$.) The current $i_S$ gradually decreases in magnitude until it reaches zero at the end of the sensor data period $T_D$, at time $t_4$, with the voltage $v_D$ corresponding to the rate of change of the sensor current $i_S$ at this time ($i_S=0$). At time $t_4$, as indicated by waveform C', the voltage $v_C$ is at the reference voltage $V_L$ of comparator A2' and diode D15 ceases conduction. This causes the D15'/R15' feedback loop to lose control of the voltage $v_S$, which then collapses to zero and remains there until the next system period starts at time $t_0'$.

At the end of the sensor data period $T_D$, the voltage $v_D$ (waveform D') is an analog of the rate of change of current $i_S$ at $i_S=0$. Correspondingly, from equation 6, the voltage $v_D$ provides an analog of the inductance $L_S$ and, thereby, of the proximity of the target object to sensor unit 10, unaffected by the resistance $R_L$. In this context, resistor R18' functions to appropriately scale the voltage $v_D$ to values having a predictable relationship to values of inductance. Accordingly, the voltage $v_D$ (at time $t_4$), obtained in accordance with the variable inductance measuring technique of the present invention, provides a calibrated indication of the inductance $L_S$ and, therefore, of the proximity of the target object to the sensor unit, the calibrated indication being independent of the temperature at the sensor unit and independent of the length and temperature of any interconnecting cable.

Considering now a preferred embodiment of the proximity sensing system and variable inductance measuring apparatus, the block diagram in FIG. 3 depicts the sensor unit 10 in equivalent circuit form (i.e., a sensor inductor designated by its equivalent inductance $L_S$, together with equivalent series resistance $R_L$ and shunt capacitance $C_L$) as well as the various stages comprising the electronic switching circuitry of the proximity sensing system. During each system period $T_S$ of the proximity sensing system, a sensor current pulse generator 20 together with capacitor C2 establish, during the sensor charge period $T_C$, a time-varying current $i_S$ through sensor unit 10. When the corresponding time-varying sensor voltage $v_S$ reaches a reference voltage $V_L$, the sensor charge period $T_C$ is terminated by a sensor control loop stage 30, with a feedback control network 32 together with a comparator A2 capturing the current $i_S$ so as to constrain the voltage $v_S$ constant at $V_L$. This action initiates the sensor data period $T_D$, which data period terminates when the current $i_S$ reaches zero and the feedback control network 32 loses control over the current $i_S$.

During the sensor data period $T_D$, a retrieval stage 40 establishes, by means of a current mirror network 42, a current which corresponds to the current $i_S$, and develops, by means of a current-to-voltage converter network 44, a voltage $v_C$ which is proportionate to the sensor current $i_S$. A differential/analog network 46 in the retrieval stage 40 differentiates the voltage $v_C$ to provide a voltage $v_D$ which is the analog of the rate of change of the current $i_S$ during the sensor data period $T_D$.

The proximity detection and switching stage 50 includes a detection and gating network 52 responsive to the calibrated level of the voltage $v_D$ at the end of the sensor data period $T_D$ to provide a target-near detection pulse when the proximity of the target object to the sensor unit 10 corresponds to a predetermined threshold actuation distance, or, actuation gap. This target-near detection pulse is quantized by a quantizing network 54. Successive quantized target-near detection pulses developed during successive system periods $T_S$ are applied to an integrating network 56 which provides a time-average proximity voltage. Finally, a Schmitt trigger and proximity switching network 58 is responsive to the time-average proximity voltage to indicate if and when a target object approaches the sensor unit 10 to a distance at or closer than the actuation gap.

Figure 4:
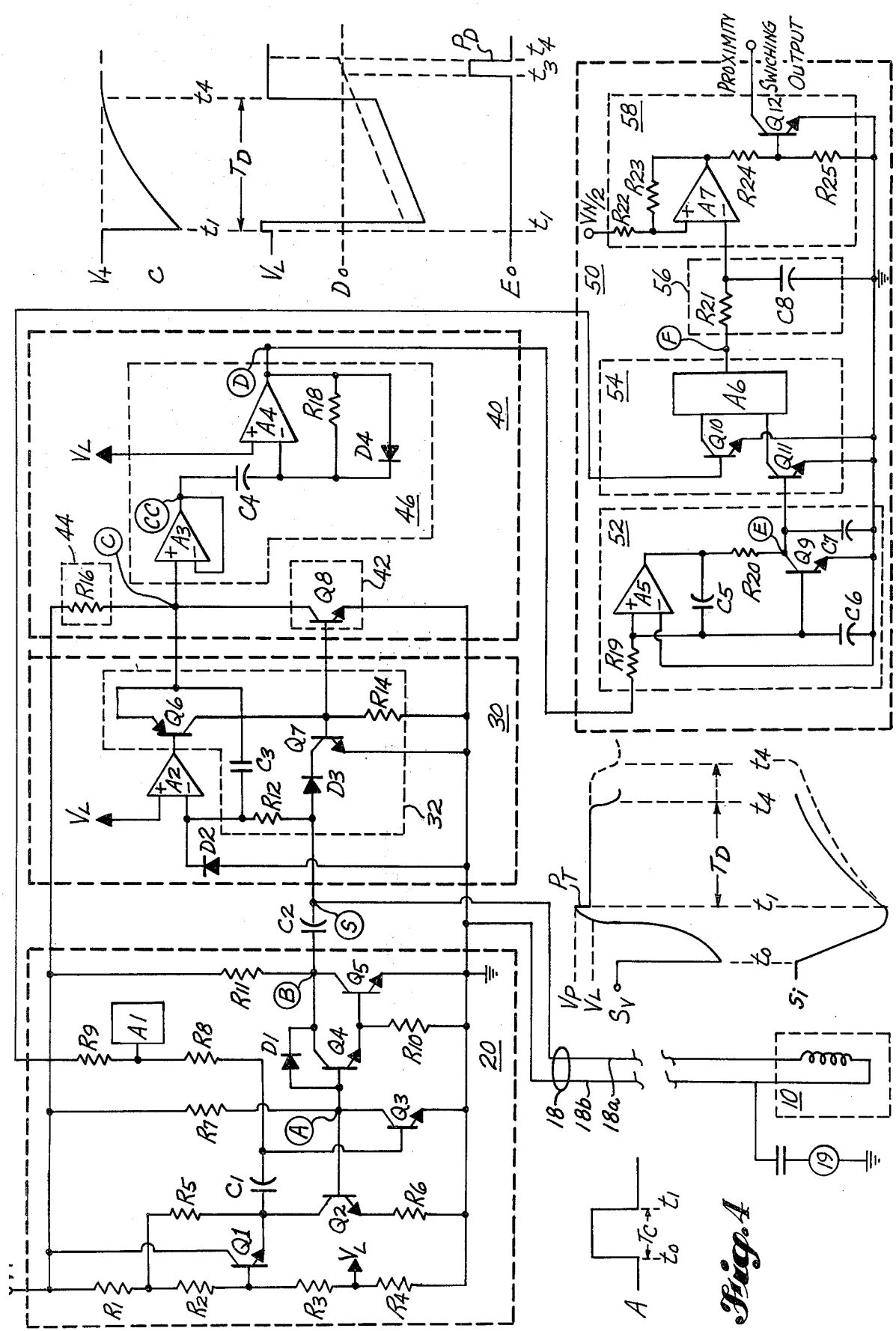
FIG. 4 is a circuit diagram of the proximity sensing system and variable inductance measuring apparatus of FIG. 3; and, FIG. 5 is a timing diagram with illustrative waveforms A, B, $S_i$, $S_v$ and C—F which are associated with corresponding circuit points of the circuit in FIG. 4.
Figure 5:
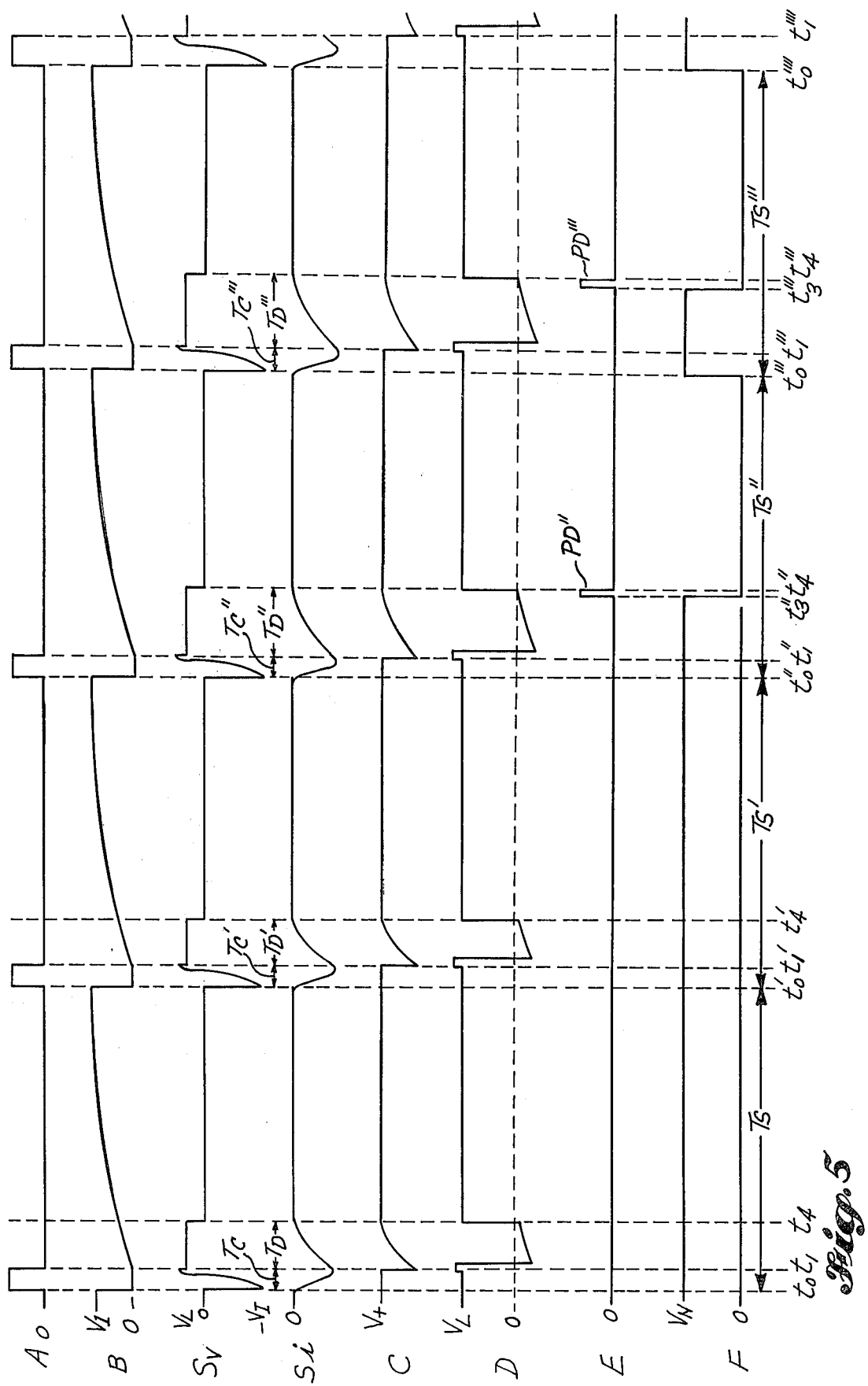

A circuit implementation of the proximity sensing system and variable inductance measuring apparatus in accordance with the present invention appears in FIG. 4. Illustrative waveforms associated with corresponding points of the circuit in FIG. 4 are presented in the timing diagrams in FIG. 5, with certain ones of these waveforms (viz., waveforms A, $S_i$, $S_v$, C, D and E) appearing in greater detail in FIG. 4. The timing diagrams in FIG. 5 represent successive system periods $T_S$, $T_{S'}$, $T_{S''}$ and $T_{S'''}$. The ensuing discussion of the circuit in FIG. 4, however, relates to a single system period $T_S$, with certain distinctions among successive system periods being noted where appropriate.

Sensor unit 10 is coupled to the electronic switching circuitry by means of an arbitrary length of cable 18 which includes wires 18a and 18b (wire 18b being common). It is assumed that the operational environment of the proximity sensing system includes various noise sources which capacitively couple into the proximity sensing system through cable 18. This is represented in FIG. 4 by a noise generator 19 in series with a noise coupling capacitor $C_C$. The inductor within sensor unit 10 is coupled by wire 18a to one end of capacitor C2 at a circuit point S. The other end of capacitor C2 (circuit point B) is coupled to the sensor current pulse generator 20.

Sensor current pulse generator 20 comprises a pulse generator A1 and transistors Q1 to Q5 together with a capacitor C1. The output of the pulse generator A1 is coupled through a resistor R8 to the base of transistor Q3, the emitter of which is grounded. The collector of transistor Q3 is coupled to the base of transistor Q4, which is coupled in a darlington configuration to transistor Q5 (a resistor R10 coupled between the emitter of transistor Q4 and ground provides biasing for the darlington pair). The collector of transistor Q5 is coupled to capacitor C2 at circuit point B, while the emitter of transistor Q5 is coupled to ground. Capacitor C2 is also coupled through a resistor R11 to a bias supply V+. As explained below, just prior to the initiation of a system period $T_S$ by pulse generator A1, capacitor C2 is charged through resistor R11 approximately to a voltage $V_I$.

Pulse generator A1 is shown to be isolated from capacitor C2 with buffering provided by transistors Q3 and Q4/Q5. This isolation can be important if the proximity sensing system operates in the presence of an external source of synchronous noise. For example, assume that noise generator 19 is the source of a signal the period of which is in near synchronization with the system period $T_S$ of the proximity sensing system. (Such a synchronous noise signal can result from a cable running adjacent cable 18, between the sensor unit and the electronic switching circuitry of another proximity sensing system.) Assume, also, that it is not feasible (for technical, economic or other reasons) to remove or significantly attenuate this synchronous signal by specifying a particular type of insulation or shielding for cable 18. In this situation, then, the synchronous noise signal will unavoidably capacitively couple into cable 18 to appear at capacitor C2. If capacitor C2 is not isolated from pulse generator A1, the pulse generator, and thereby the system period $T_S$, might be pulled into synchronization with the external noise signal. The result could be interference appearing synchronously during each system period $T_S$ and adding to the signals in the following stages of the proximity sensing system. This synchronous interference could, in turn, erroneously affect the switching of the proximity sensing system.

To avoid such a possibility in a preferred embodiment of the proximity sensing system, pulse generator A1, in addition to being isolated from capacitor C2 and cable 18, is made to exhibit a random period. The provision for a random period of the pulse generator A1, and therefore a random system period $T_S$, further insures that the proximity sensing system cannot fall into synchronization with an external noise source. In other words, the use of pulse generator A1 to provide for a random system period $T_S$ randomizes the effect of any noise sources on the switching of the proximity sensing system. The result of this frequency shifting is random noise which is filtered in the proximity detection and switching stage 50 as described below.

It should be noted that randomizing the system period $T_S$ of the proximity sensing system correspondingly affects the voltage which is on capacitor C2 at the start of a system period $T_S$, which voltage is dependent upon the R11/C2 time constant and the, now random, system period. Thus, at the beginning of successive system periods, the voltage on capacitor C2 can fall in a relatively narrow range about the above mentioned voltage $V_I$. However, as becomes apparent below, the precise voltage on capacitor C2 at the start of a system period $T_S$ does not affect the determination of the inductance $L_S$ of the inductor within sensor unit 10. Accordingly, in the ensuing discussion, the voltage across capacitor C2 at the start of the system period is given to be $V_I$, with the effect of randomizing this voltage being noted where appropriate.

Pulse generator A1 is normally in a high state, dropping momentarily to ground to provide an initiation pulse at time $t_0$ corresponding to the initiation of the sensor charge period $T_C$ of a system period $T_S$. This initiation pulse turns off transistor Q3 (see waveform A), turning on the darlington pair, transistors Q4 and Q5, with base drive supplied to transistor Q4 through a resistor R7 coupled to bias supply V+. When transistor Q5 turns on, the end of capacitor C2 at circuit point B is connected to ground. This places capacitor C2, which has been charged through resistor R11 to the voltage $V_I$, across the sensor unit 10, impressing the voltage $-V_I$ on the sensor inductor. The resonant network formed by the sensor inductor and capacitor C2 then begins to oscillate (starting a time $t_0$). After the initiation of a system period $T_S$ at time $t_0$, the voltage $v_S$ across, and the current $i_S$ through, the sensor inductor can be described with reference to, respectively, the waveforms $S_v$ and $S_i$ associated with circuit point S. Thus, at time $t_0$, due to the polarity of capacitor C2 shown, the voltage across the sensor inductor drops abrupting negative to $-V_I$, thereafter increasing in a damped sinusoidal fashion through zero. The current through the sensor inductor is initially zero at time $t_0$, increasing negatively in damped sinusoidal fashion thereafter.

After pulse generator A1 has turned on transistor Q3, the termination of the initiation pulse from pulse generator A1 does not terminate the off-cycle of transistor Q3 because of the operation of transistors Q1 and Q2 together with capacitor C1. The base of transistor Q2 is coupled to the collector of transistor Q3 at circuit point A. The emitter of transistor Q2 is coupled through a current limiting resistor R6 to ground, while the collector of transistor Q2 is coupled to the emitter of transistor Q1 and, through resistors R1 and R5, to bias supply V+. Both the base, through resistors R2 and R1, and the emitter of transistor Q1 are coupled to bias supply V+. Capacitor C1 is coupled between the collector of transistor Q2 and the base of transistor Q3. Resistors R3 and R4, coupled between the base of transistor Q1 and ground, bias transistor Q1, with the reference voltage $V_L$ appearing across resistor R4. At the initiation of the system period $T_S$ at time $t_0$, when transistor Q3 turns off, transistor Q2 turns on with base drive supplied by resistor R7. With transistor Q2 on, its collector voltage drops by the voltage drop across resistor R5. This voltage drop at the emitter of transistor Q1 turns transistor Q1 on, supplying current to transistor Q2 to prevent it from saturating and, thereby, diverting base current from transistor Q4. When the collector voltage on transistor Q2 drops, the voltage on the side of capacitor C1 which is coupled to the collector of transistor Q2 also drops. This voltage drop is reflected to the other side of capacitor C1 (initially at approximately the base-to-emitter voltage of transistor Q3 above ground), pulling the base of transistor Q3 below ground to back bias transistor Q3 off. This back-biasing action occurs before the initiation pulse from pulse generator A1 terminates and the output from pulse generator A1 returns high.

Thereafter, capacitor C1 is slowly charged by pulse generator A1 through resistor R8.

Capacitor C1 is included in sensor current pulse generator 20 to protect the electronic switching circuitry of the proximity sensing system from stalling. As is explained more fully below, the on-cycle of transistors Q2 and Q4/Q5, and the off-cycle of transistor Q3, is terminated at time $t_1$ by a negative-going voltage pulse $P_T$ which appears at circuit point S. This termination pulse $P_T$ is reflected through capacitor C2 and a diode D1 coupled between the collector and the base of transistor Q4 to the base of transistor Q2, turning it off. With transistor Q2 off, the voltage at the base of transistor Q3 rises abruptly turning it on and turning transistors Q4/Q5 off, thereby terminating the sensor charge period $T_C$ (at time $t_1$). This action is represented by the trailing edge, at time $t_1$, of the waveform A associated with circuit point A. With transistor Q5 off, the top end of capacitor C2 at circuit point B is no longer grounded (and, therefore, no longer coupled across the sensor inductor), thus permitting capacitor C2 to charge once again through resistor R11 toward the voltage $V_I$ (see waveform B, FIG. 5). Now, if the termination pulse $P_T$ does not appear on the bases of transistors Q4 and Q2, transistor Q2 remains on, clamping the transistor Q3 off and the transistors Q4/Q5 on. Without the action of capacitor C1, capacitor C2 would then remain coupled across the sensor unit 10 and be prevented from recharging (the system would stall). Capacitor C1 is included so that even in the absence of a terminating pulse $P_T$, capacitor C1 eventually must charge through resistor R8 to a point where transistor Q3 is biased on, turning off transistor Q4/Q5 (and Q2) and allowing capacitor C2 to recharge.

Consider now the sensor control loop stage, indicated generally at 30 in FIG. 4, which includes comparator A2 and feedback control network 32. Comparator A2 is referenced to a voltage $V_L$ greater than zero. The inverting input to comparator A2 is coupled through a resistor R12 to circuit point S, and through a diode D2 to ground. Diode D2 limits the negative voltage at the inverting input to comparator A2 during the time the voltage $v_S$ is negative. The feedback control network 32, coupled between the output of and the inverting input to comparator A2, is comprised of transistors Q6 and Q7 and a stabilization capacitor C3. The output of comparator A2 is coupled to the base of transistor Q6, while the collector of transistor Q6 is coupled to the base of transistor Q7. The collector of transistor Q7 is coupled through a diode D3 directly to circuit point S and through resistor R12 to the inverting input to comparator A2, while its emitter is coupled to ground. To insure the stability of comparator A2, the inverting input to the comparator is also coupled through stabilization capacitor C3 to the emitter of transistor Q6. A resistor R14, coupled between the collector of transistor Q6 and ground, also aids in the stability of comparator A2 by reducing the impedance of transistor Q6 at low current levels.

Referring to waveforms $S_v$ and $S_i$, during the sensor charge period $T_C$ (commencing at time $t_0$) the damped sinusoidal voltage $v_S$ across the sensor unit 10 increases from approximately $-V_I$, eventually swinging positive. Correspondingly, during this time the current through the sensor inductor is increasing negatively in a damped sinusoidal manner. In a given system period $T_S$, the randomizing function performed by pulse generator A1 affects only the initial value of the voltage $v_S$ (impressed by capacitor C2). After time $t_0$, the waveforms $S_v$ and $S_i$ are determined in accordance with equation 1. At approximately the time (between times $t_0$ and $t_1$) when the voltage $v_S$ crosses zero, the current $i_S$ peaks negatively, and begins to decrease in magnitude toward zero. (The current $i_S$ does not peak exactly when the voltage $v_S$ is zero due to the effect of the series equivalent resistance $R_L$.) Also, during the sensor charge period $T_C$ the voltage at the inverting input to comparator A2 is below the reference voltage $V_L$. As a result, the output of comparator A2 is high, being by design equal to the bias supply voltage $V+$. Thus, transistor Q6 is off, holding transistor Q7 off.

Eventually, between times $t_0$ and $t_1$, the sensor voltage $v_S$ rises to the reference voltage $V_L$. This causes the output of comparator A2 to slew rapidly negative, turning on transistor Q6 and, thereby, transistor Q7. This action closes the feedback loop between the output of and the inverting input to comparator A2, establishing feedback control and thereby constraining the voltage at the inverting input to the comparator, i.e., the voltage $v_S$, to the reference voltage $V_L$. In establishing feedback control, transistor Q7 "captures" the current $i_S$, sinking just a sufficient current through diode D3 to hold the sensor voltage $v_S$ constant at $V_L$. Actually, the entire sensor current $i_S$ does not flow through transistor Q7 during the sensor data period due to the presence of capacitor C2. However, the error current between sensor unit 10 and capacitor C2 during this period is relatively small and is constant. This error current can be readily corrected through calibration and therefore does not affect the accuracy of the proximity data developed by the proximity sensing system. In the ensuing discussion, the current $i_S$ is assumed to be the current through sensor unit 10, less the error current between the sensor unit and capacitor C2.

Due to the presence of the stabilization capacitor C3, feedback control is not established at the precise time at which the voltage $v_S$ first reaches the reference voltage $V_L$. Rather, feedback control over the rising sensor voltage is delayed for a time determined by the R12/C3 stabilization time constant. During this delay, the voltage $v_S$ continues to rise to a value $v_P$ at time $t_1$ which is greater than reference voltage $V_L$ (see waveform $S_v$). At time $t_1$, feedback control is fully established and the voltage $v_S$ drops abruptly from $v_P$ to $V_L$, providing a negative-going voltage pulse at circuit point S. This negative-going pulse is the terminating pulse $P_T$, discussed above, which is reflected through capacitor C2 and the collector of transistor Q4 to the bases of transistors Q4 and Q2, switching them off and terminating the sensor charge period $T_C$ at time $t_1$. To accomplish this termination function, the magnitude of the terminating pulse $P_T$ should be approximately one volt, with the R12/C3 stabilization time constant being established accordingly.

Referring to the sensor current waveform $S_i$, with the voltage $v_S$ contrained to be constant, the current $i_S$ no longer changes in a damped sinusoidal manner, but rather approaches zero in the approximate manner of a ramp function. From equation 5, it is apparent that the current $i_S$ is not a perfect ramp; rather, due to the effect of the equivalent series resistance $R_L$, the rate of change of the current $i_S$ decreases as the sensor current approaches zero.

Eventually, at a time $t_4$, the current $i_S$ reaches zero and begins to reverse. However, the current through transistor Q7 cannot reverse, and transistor Q7 and diode D3 become nonconducting. This action causes the feedback control network 32 to lose control of the sensor current, with the voltage across the sensor unit 10 collapsing to zero. From above, the time from $t_1$ to $t_4$ over which the sensor control loop stage 30 controls the current $i_S$ is denominated the sensor data period $T_D$. In a preferred embodiment, each system period $T_S$ is on the order of ten times longer than the associated sensor data period $T_D$. The resulting delay between successive sensor data periods allows for an adequate proximity sensing data rate while keeping the duty cycle of the proximity sensing system short to reduce power consumption. The period randomizing function embodied in pulse generator A1, by reason of the attendant randomizing of the initial voltage $V_I$ impressed by capacitor C2 across sensor unit 10, affects to a relatively minor extent the duration of both the sensor charge period $T_C$ and the sensor data period $T_D$. Specifically, an increase (decrease) in the voltage $V_I$ at time $t_0$ causes an increase (decrease) in the current in the sensor unit at the beginning of the sensor data period $T_D$ and an increase (decrease) in the initial rate of change of the current $i_S$. As a result, the time $t_4$ at which the sensor data period $T_D$ ends occurs later (earlier); however, beyond this initial effect, the rate of change of the current $i_S$ is unaffected, being established by the inductance $L_S$ of the sensor inductor in accordance with equation 5.

Consider now the retrieval stage, indicated generally at 40 in FIG. 4, which includes current mirror network 42, current-to-voltage converter network 44 and differential/analog network 46. During the sensor data period $T_D$, the current $i_S$ also flows through transistor Q7 in the feedback control network 32. Current mirror network 42 is comprised of a transistor Q8 having its base coupled to the base of transistor Q7 while its collector is coupled to circuit point C at the emitter of transistor Q6 and its emitter is grounded. Transistor Q8 is matched to transistor Q7 so that the current through transistor Q8 is proportionate to the current through transistor Q7 (the current $i_S$) at all current levels.

The current-to-voltage converter network 44 of retrieval stage 40 is comprised of a resistor R16 coupled between bias supply V+ and the collector of the current mirror transistor Q8 at circuit point C. Since, during the sensor data period, the current through transistor Q8 is proportionate to the current $i_S$, the voltage $v_C$ developed across resistor R16 (waveform C) is directly proportionate to the current $i_S$ over the same period. Thus, the waveform C associated with circuit point C corresponds to the waveform $S_i$ of the sensor current $i_S$. More specifically, over the sensor data period $T_D$, the rate of change of the voltage $v_C$ corresponds to the rate of change of current $i_S$. Thus, at time $t_1$ the waveform at circuit point C drops abruptly below V+ and then rises toward V+ in the approximate manner of a ramp function. At the end of the sensor data period $T_D$ at time $t_4$, the voltage $v_C$ reaches V+, which corresponds to the current $i_S$ reaching zero.

The voltage $v_C$ is applied to the differential/analog network 46, the purpose of which is to differentiate the voltage $v_C$ and, thereby, develop a voltage $v_D$ which is the analog of the rate of change of the current $i_S$, in particular at time $t_4$ when the current $i_S$ is zero. Differential/analog network 46 comprises a buffer amplifier A3 and a differentiating circuit which includes a capacitor C4 and a calibration resistor R18 together with an operational amplifier A4. The noninverting input to buffer amplifier A3 is coupled to circuit point C, while the output of the buffer amplifier A3 is coupled to capacitor C4 at circuit point CC and to its inverting input. The noninverting input to operational amplifier A4 is coupled to the reference voltage $V_L$, while its inverting input is coupled to capacitor C4. The output of operational amplifier A4 is coupled through calibration resistor R18 and a diode D4 to its inverting input and to capacitor C4. It should be noted that the noninverting input to operational amplifier A4 is coupled to the same voltage, $V_L$, which forms the reference voltage for comparator A2 in the sensor control loop stage 30. This voltage reference arrangement insures that any variation in the voltage $V_L$ (appearing across resistor R4) does not affect the determination of the inductance $L_S$ of the sensor inductor since such variation would appear equally in both the numerator and the denominator of the expression for the inductance $L_S$ in equation 5.

Differential/analog network 46 develops an analog of the rate of change of current $i_S$ as follows. Buffer amplifier A3 provides current isolation between the differential/analog network and the preceding current-to-analog converter network 44. This limits the current which capacitor C4 draws from the current-to-voltage converter network so that the waveform associated with the voltage $v_C$ at circuit point C remains unaffected. Due to the operation of buffer amplifier A3, the waveform at circuit point CC corresponds to the waveform at circuit point C. Thus, prior to the start of the sensor data period $T_D$ at time $t_1$, the side of capacitor C4 at circuit point CC is at V+ volts while the other side of the capacitor is at $V_L$ volts. At time $t_1$, the voltage at circuit point CC (waveform C) drops abruptly. In response, the output of operational amplifier A4 rises sufficiently positive above $V_L$ to allow diode D4 to discharge capacitor C4. The output of operational amplifier A4 then drops negative, sinking sufficient current through calibration resistor R18 to maintain the voltage at its inverting input at $V_L$.

Capacitor C4 and calibration resistor R18 differentiate the waveform at circuit point CC associated with the voltage $v_C$. Operational amplifier A4 provides an AC ground for the differentiating capacitor C4 coupled to its inverting input, thereby minimizing the differential error term which would result if the capacitor were coupled through resistor R18 to ground. Accordingly, the current that the differentiating capacitor C4 draws through, and therefore the time-derivative voltage developed across, calibration resistor R18 directly corresponds to the differential of the waveform C at circuit point CC. Thus, during the sensor data period $T_D$, and particularly at the end of the sensor data period at time $t_4$, the voltage $v_D$ across the calibration resistor R18 (circuit point D) is the analog of the rate of change of the voltage $v_C$ and, thereby, of the rate of change of the current $i_S$.

The voltage $v_D$ is represented by waveform D and comprises the output from the retrieval stage 40 of the proximity sensing system. In particular, at the end of the sensor data period $T_D$ at time $t_4$ ($i_s = 0$), the voltage $v_D$ is related to the inductance $L_S$ of the sensor inductor. Substituting into equation 6 to reflect the above relationships yields $$L_S \alpha \frac{1}{\frac{di_s}{dt}} \alpha \frac{1}{\frac{dv_s}{dt}} \alpha \frac{1}{v_D} \bigg|_{i_S = 0} \quad (8)$$

Thus, the inductance measuring technique of the present invention, embodied in the sensor current pulse generator stage 20, the sensor control loop stage 30 and the retrieval stage 40, provides a measure of the inductance $L_S$ unaffected by the variability of either the equivalent shunt capacitance $C_L$ or the equivalent series resistance $R_L$.

Referring to the waveform D associated with the analog voltage $v_D$, it is evident that the voltage $v_D$ does not remain constant over the sensor data period $T_D$. From equation 5, and assuming that the inductance $L_S$ remains relatively constant, a nonconstant voltage $V_D$ reflects the fact that $di_S/dt$ gradually decreases during the sensor data period due to the effect of the equivalent series resistance $R_L$. While the shape of the waveform D is determined, in accordance with equation 5, by the rate of change of the current $i_S$ during the sensor data period $T_D$, the actual voltage level at circuit point D during this period is established by the choice of a value for calibration resistor R18. In particular, the calibration resistor R18 determines the level of the voltage $v_D$ at the end of the sensor data period when the current $i_S$ is zero. Accordingly, the voltage $v_D$ at the end of the sensor data period comprises a scaled measure of the inductance $L_S$ and, thereby, of the proximity of the target object to sensor unit 10. As explained more fully below, in the present invention the calibration value for resistor R18 is chosen to calibrate the proximity switching of the proximity sensing system to a predetermined actuation gap.

The voltage $v_D$ from retrieval stage 40 is applied to the proximity detection and switching stage 50. In response to the voltage $v_D$, the proximity detection and switching stage 50 outputs a target-near detection pulse when the target object approaches the sensor unit to a distance at or closer than a predetermined actuation gap. From above, since the target object is assumed to be of a magnetic material, the inductance $L_S$ increases as the target object is brought into closer proximity to sensor unit 10, which, from equation 5, results in a decrease in the rate of change of the current $i_S$ during the sensor data period $T_D$. Such a decrease in $di_S/dt$ is reflected by the dashed portion of the waveform $S_i$ in FIG. 4, with the time $t_4$ at which the sensor circuit $i_S$ reaches zero, and at which the sensor voltage $v_S$ drops from $V_L$ (waveform $S_v$), being correspondingly later. Thus, an increase in the inductance $L_S$ results in the increase in duration of the sensor data period $T_D$, as is evidenced by the increased sensor data period during the system periods $T_S''$ and $T_S'''$ in FIG. 5. It will be noted, however, that the sensor data period $T_D$ remains substantially shorter than the system period $T_S$. This decrease in the rate of change of current $i_S$ is also reflected in a corresponding change in the voltage $v_D$, as indicated by the dashed portion of the waveform D. Thus, an increase in the inductance $L_S$, corresponding to the closer proximity of the target object to sensor unit 10, results in an increase in the voltage $v_D$ during the sensor data period $t_D$ and, in particular, in an increase in the voltage $v_D$ at the end of the sensor data period at time $t_4$ (see waveform D in FIG. 5 during system periods $T_S''$ and $T_S'''$).

If and when the target object approaches sensor unit 10, it eventually reaches the actuation gap which is arbitrarly chosen to correspond to a target-near condition of the proximity sensing system. For reasons apparent below, calibration resistor R18 is chosen so that the analog voltage $v_D$ at the end of the sensor data period $T_D$ is zero when the inductance $L_S$ of the sensor inductor corresponds to the target object being at this actuation gap, as is reflected by the dashed portion of the waveform D which reaches zero at time $t_3$.

The voltage $v_D$ is applied to the detection and gating network 52 of the proximity detection and switching stage 50. Detection and gating network 52 is comprised of a detection comparator A5 and a gating transistor Q9. Both the noninverting input to detection comparator A5 and the base of gating transistor Q9 are coupled through a resistor R19 to the circuit point D corresponding to the output of the retrieval stage 40. The inverting input to detection comparator A5 is connected to ground, establishing a ground reference level. A stabilization capacitor C5 is coupled between the output of and the noninverting input to detection comparator A5. The output of detection comparator A5 is coupled through a resistor R20 to the collector of gating transistor Q9 at circuit point E, while the emitter of the transistor Q9 is grounded. A capacitor C6 is coupled between the base of gating transistor Q9 and ground to suppress any switching transients.

The voltage $v_D$ appears on the noninverting input to detection comparator A5 and on the base of gating transistor Q9. Prior to time $t_1$, the output of operational amplifier A4 at circuit point D is high (at $V_L$), with the result that the output from detection comparator A5 is high and gating transistor Q9 is turned on. With gating transistor Q9 on, the output of the detector and gating network 52 at circuit point E is low (i.e., at ground). Shortly after the initiation of the sensor data period $T_D$, the output of operational amplifier A4 drops below ground, turning off transistor Q9 and switching detection comparator A5 (referenced to ground) low. As a result, the output voltage from detection and gating network 52 at circuit point E remains low.

During the sensor data period $T_D$, the voltage $v_D$ gradually increases as described above. If the inductance $L_S$ corresponds to a target object distance from sensor unit 10 which is greater than the actuation gap, then the waveform D (solid line) does not reach zero (the reference level of detection comparator A5) before time $t_4$. Thus, the gated output at circuit point E remains low for the duration of the sensor data period $T_D$. At the end of the sensor data period $T_D$, the output of operational amplifier A4 switches high, switching detection comparator A5 high, while at the same time switching gating transistor Q9 on to hold circuit point E low.

When, however, the proximity of the target object to sensor unit 10 corresponds to the actuation gap, the inductance $L_S$ is such that the waveform D (dashed line) associated with the voltage $v_D$ reaches zero at a time $t_3$ just prior to the end of the sensor data period $T_D$. As described above, at time $t_1$ the output of operational amplifier A4 drops below ground, turning off transistor Q9 and switching detection comparator A5 low. When just prior to the end of the sensor data period $T_D$, the waveform D (dashed line) reaches zero volts (the reference level of detection comparator A5), detection comparator A5 switches high before gating transistor Q9 is turned on. The result is a gated target-near detection pulse $P_D$ on the output of detection and gating network 52 at circuit point E (see waveform E). It follows that, if the target object approaches sensor unit 10 closer than the actuation gap, with a resulting further increase in the inductance $L_S$, the time $t_3$ at which the calibrated voltage $v_D$ attains zero occurs sooner, increasing the pulse width of the target near detection pulse $P_D$. (The level of the voltage $v_D$ may, due to increased inductance $L_S$ or noise, reach a voltage sufficient to turn on gating transistor Q9 prior to the end of the sensor data period, thereby terminating the target near detection pulse prior to time $t_4$.)

The output of detection and gating network 52 is applied to the quantizing network 54. Quantizing network 54 is responsive to this output to provide, in each system period $T_S$, a discrete quantum output. More particularly, the function of the quantizing network is to insure that, for each system period $T_S$, a target-near detection pulse $P_D$ occurring during the sensor data period $T_D$ results in the transfer of a discrete quantum of charge between the quantizing network 54 and the integrating network 56 irrespective of the quality of the target-near detection pulses. This function is especially important where the proximity sensing system operates in the presence of electromagnetic interference, with noise signals being unavoidably introduced into the cable 18 between the electronic switching circuitry of the proximity sensing system and the sensor unit 10 (represented by noise generator 19 and coupling capacitor $C_C$). The capacitively coupled noise signals, amplified in the later gain stages of the proximity sensing system, can distort the target-near detection pulses $P_D$. Specifically, this interference may result in the erroneous occurrence or nonoccurrence of a target-near detection pulse, or may distort its magnitude and/or pulse width.

The quantizing network 54 is comprised of transistors Q10 and Q11 together with a flip-flop circuit A6. The base of transistor Q10 is coupled through resistor R9 to the output of pulse generator A1 in the sensor current pulse generator 20. The base of transistor Q11 is coupled to the circuit point E in the detection and gating network 52. The emitter of transistor Q10 and the emitter of transistor Q11 are coupled to ground. A capacitor C7 is coupled between the base of transistor Q11 and ground and functions to suppress switching transients. The collector of transistor Q10 is coupled to one input of flip-flop A6 while the collector of transistor Q11 is coupled to the other input.

At the start of the system period $T_S$ at time $t_0$, the output of pulse generator A1 drops low, turning off transistor Q10 and setting flip-flop A6 in its high state (given to be a voltage $V_N$). At this time, transistor Q11 is held off by the low level output of the detection and gating network 52 output (circuit point E). From above, the output level of the detection and gating network 52 changes only if a target-near condition occurs during the sensor data period $T_D$. Thus, if the distance between the target object and the sensor unit 10 exceeds the actuation gap during the sensor data period $T_D$, the sensor data period terminates at time $t_4$ without the occurrence (ignoring possible noise effects) of a target-near detection pulse $P_D$. As a result, transistor Q11 remains off and flip-flop A6 remains in its high state for the entire corresponding system period. However, if the target object approaches sensor unit 10 to the actuation gap or closer, detection and gating network 52 provides a target-near detection pulse $P_D$ in the manner described above. This detection pulse (at time $t_3$) turns on transistor Q11 and sets flip-flop A6 in its low state (given to be ground). Flip-flop A6 remains low for the duration of the system period $T_S$, i.e., from time $t_3$ until the initiation of a new system period when the output of pulse generator A1 drops low and transistor Q10 turns off, returning the flip-flop A6 to its high state.

To summarize and with reference to waveforms E and F in FIG. 5, if, during a given system period, the target object is at a distance from sensor unit 10 greater than the actuation gap, the output from quantizing network 54 (circuit point F) is high for the entire system period and for each system period thereafter in which a target-near condition does not exist. This situation is represented in FIG. 5 during system periods $T_S$ and $T_S'$. If the target object is caused to approach sensor unit 10, it eventually reaches the actuation gap corresponding to a target-near condition, which is assumed to be the case during system periods $T_S''$ and $T_S'''$. Thus, during the system periods $T_S''$ and $T_S'''$, the output from the flip-flop A6 in quantizing network 54 is high from the initiation of the corresponding system period at times $t_0''$ and $t_0'''$ until, respectively, the times $t_3''$ and $t_3'''$ during the sensor data periods $T_D''$ and $T_D'''$ when respective target-near detection pulses $P_D''$ and $P_D'''$ occur. At the time $t_3''$ ($t_3'''$) of the detection event, flip-flop A6 switches low for the remainder of the system period. Since each system period $T_S$ is substantially longer than the combined sensor charge and sensor data periods $T_C$ and $T_D$ as target-near condition resulting in a target-near detection pulse $P_D$ causes the output of quantizing network 54 to be low for a substantially longer time than it is high, as is evident in waveform F during the system periods $T_S''$ and $T_S'''$.

From the above, it can be seen that this quantized output from quantizing network 54 does not depend on either the magnitude or the pulse width of a target-near detection pulse $P_D$. Rather, among successive system periods, the only discrepancies in the quantized output from quantizing network 54 (ignoring for the moment the possible erroneous occurrence or nonoccurrence of a target-near detection pulse $P_D$) result from either the randomizing effect of pulse generator A1 or, for the target-near condition, discrepancies in the time $t_3$ of the associated system period at which the quantizing network 54 switches its output low. The randomizing function of pulse generator A1 effects the quantized output directly by randomly changing the duration of each system period $T_S$, and indirectly by changing the initiation and termination time $t_1$ of the sensor data period $T_D$ (through its effect on the voltage $V_I$ on capacitor C2 which is impressed across sensor unit 10). In the latter case, changing the termination time $t_1$ also affects, for a target-near condition, the time $t_3$ at which a target-near detection pulse occurs. In either case, the effect of period generator A1 on the quantized output from quantizing network 54 is, inherently, random. As is made evident below, such random effects do not affect the accuracy of the proximity switching output from the proximity sensing system. Nonrandom discrepancies do occur in the quantized output from the quantizing network 54 but do not affect its accuracy. Specifically, for a system period in which a target-near condition exists, as the target object approaches the sensor unit 10 within the actuation gap, the time $t_3$ at which a target-near detection pulse $P_D$ occurs happens closer to the time $t_0$ at which the system period commences. The result is that the ratio between the corresponding high (between times $t_0$ and $t_3$) and low (between time $t_3$ and the end of the system period) levels of the quantized output is altered, with the maximum discrepancy being approximately the sensor data period $T_D$, which is assumed to be substantially less than the system period $T_S$. Accordingly, the quantizing technique of the present invention provides an effective means for filtering the target near detection pulses $P_D$ from detection and gating network 52.

Over successive system periods $T_S$, the quantized output from quantizing network 54 is applied to the integrating network 56. Integrating network 56 comprises an RC integrator, formed by a resistor R21 coupled between quantizing network 54 (circuit point F) and an integrating capacitor C8, coupled to ground. The integrating network 56 filters the successive quantized outputs from the quantizing network (circuit point F) to develop a time-average proximity voltage across capacitor C8. Specifically, and ignoring for the moment noise effects, if during a succession of system periods the target object is beyond the actuation gap relative to sensor unit 10, no target-near detection pulses occur and discrete quanta of charge are transferred to capacitor C8. Therefore, the capacitor C8 gradually charges toward $V_N$. On the other hand, if during a succession of system periods the target object is at or closer than the actuation gap, then during those system periods discrete quanta of charge are removed from capacitor C8 by quantizing network 54, with capacitor C8 gradually discharging toward ground.

The development of a time-average proximity voltage by integrating network 56 is important because, as noted above, noise signals can be capacitively coupled into the proximity sensing system. These noise signals can result in the erroneous occurrence or nonoccurrence of a target-near detection pulse $P_D$ directly, by affecting the output from detection and gating network 52, or indirectly, by affecting the voltage $v_D$ at the input to the detection and gating network. Such noise signals are, however, random (or randomized in the case of quasi-synchronous external noise sources). Thus, if, over a succession of system periods, target-near detection pulses occur in less than 50% of the system periods reflecting the probability of a target-far condition, the the time-average proximity voltage on capacitor C8 gradually rises toward $V_N$ (the voltage corresponding to the high state of flip-flop A6). On the other hand, if the target-near detection pulses occur during more than 50% of the system periods, corresponding to the probability of a target near condition, then the time-average of the output from quantizing network 54 is low, and the capacitor C8 gradually discharges to reflect this. Thus, the random noise effects cancel out, and the time-average proximity voltage on capacitor C8 accurately reflects the target-near/far condition of the target object with respect to sensor unit 10.

The time-average proximity voltage output from integrating network 56 is applied to the Schmitt trigger and proximity switching network 58. Operational amplifier A7 together with feedback resistors R22 and R23 form a Schmitt trigger while proximity switching transistor Q12 provides the proximity switching output of the proximity sensing system. The inverting input to operational amplifier A7 is coupled to integrating capacitor C8, while the noninverting input is coupled through resistor R22 to a positive voltage $V_N/2$ which is given to be one-half the voltage $V_N$ (which corresponds to the high state of the flip-flop A6). The output of operational amplifier A7 is coupled through resistor R23 to its noninverting input and through a resistor R24 to the base of proximity switching transistor Q12. A biasing resistor R25 is coupled between the base of the proximity switching transistor Q12 and ground. The feedback voltage divider formed by resistors R22 and R23 functions to change the trigger voltage of operational amplifier A7 in the manner of conventional Schmitt triggers. Thus, if the time-average proximity voltage applied to the inverting input to operational amplifier A7 is near $V_N$, the output of the operational amplifier is low. As a result, the feedback voltage divider R22/R23 causes the trigger voltage at the noninverting input to operational amplifier A7 to be at some intermediate value between $V_N/2$ and ground. Thus, to cause a change in the output of the Schmitt trigger, the time-average proximity voltage must fall below such intermediate trigger level. If it does, then the output of the operational amplifier A7 switches high, causing the trigger voltage of the Schmitt trigger to rise to some intermediate level between $V_N/2$ and $V_N$.

The Schmitt trigger and proximity switch network 58 functions as follows. Assuming that the distance between the target object and sensor unit 10 exceeds the actuation gap, then the time-average, over successive system periods $T_S$, of the output from quantizing network 56 corresponds to a time-average nonoccurrence of target-near detection pulses $P_D$. Accordingly, the time-average proximity voltage on capacitor C8 is at $V_N$ above the trigger level of operational amplifier A7. This causes the output of operational amplifier A7 to be low, with the result that proximity switching transistor Q12 is turned off. This state of proximity switching transistor Q12 corresponds to a target-far condition of the proximity sensing system, indicating that the target object has not approached sensor unit 10 to the actuation gap distance.

When, however, the distance between the target object and sensor unit 10 is reduced to the actuation gap or closer, successive target-near detection pulses $P_D$ appear at the output of detection and gating network 52. As a result, in the manner described above, for each system period $T_S$ in which a target-near detection pulse $P_D$ occurs, a discrete quantum of charge is removed from capacitor C8. Accordingly, the time-average proximity voltage across capacitor C8 decreases toward ground. Eventually, capacitor C8 is discharged below the trigger level of the Schmitt trigger (i.e., below the intermediate voltage between $V_N/2$ and ground) and the output of Schmitt trigger amplifier A7 switches high. This action turns on proximity switching transistor Q12, providing a target-near indication from the proximity sensing system.

The present invention has been described in relation to a preferred proximity sensing system which incorporates a novel inductance measuring technique. The proximity sensing system utilizes a remote sensor unit which includes only a single circuit element, a sensor inductor, and is coupled to the electronic switching circuitry of the proximity sensing system by means of an arbitrary length of cable containing only two wires, one of which is common. The inductance measuring network periodically develops calibrated determinations of the inductance $L_S$ of the sensor inductor which are independent of the temperature at the sensor unit and independent of the length and temperature of the interconnecting cable. These periodic inductance determinations are used to provide an accurate and reliable indication of the proximity of the target object to the sensor unit which is unaffected by changes in the temperature of the environment in which the sensor unit is located. This improvement in proximity sensing accuracy and reliability is accomplished with an attendent decrease in the complexity and cost of the proximity sensor system.

Other embodiments and modifications of the present invention will readily be apparent to those of ordinary skill in the art having the benefit of the teachings presented in the foregoing description of the preferred embodiment and the drawings. It is therefore to be understood that this invention is not to be construed as limited to the recitations in the preferred embodiment but that such modifications and embodiments are intended to be included within the scope of the appended claims.

The embodiments of the invention in which an exclusive property or privilege is claimed are defined as follows:

1. A method for determining the inductance L of a network, wherein the network includes an equivalent resistance in series with the inductance L and an equivalent capacitance in shunt with the inductance L, comprising the steps of:

establishing a current i through the network, said network current having a time-variable waveform;

thereafter, constraining the voltage across said network to be constant when said network voltage reaches a reference voltage $V_L$, whereby the effect of the equivalent capacitance is cancelled;

while so constraining said network voltage to be constant, determining the rate of change of said network current with respect to time when said network current is zero, whereby the effect of the equivalent resistance is cancelled; and determining the inductance L in accordance with the relationship $$L = \frac{V_L}{\frac{di}{dt}} \bigg|_{i=0}$$

2. The method defined in claim 1 wherein the step of constraining said network voltage comprises the steps of:

comparing said network voltage with the reference voltage $V_L$; and, when said network voltage reaches the reference voltage $V_L$, thereafter controlling said network current so as to maintain said network voltage at the reference voltage $V_L$.

3. The method defined in claim 2 wherein the step of determining the rate of change of said network current includes the steps of:

developing a voltage $v_C$ which is proportionate to said network current; and, differentiating said voltage $v_C$ to obtain a voltage $v_D$ which is the analog of the rate of change of said voltage $v_C$, and thereby the analog of the rate of change of said network current.

4. The method defined in claim 1 wherein the step of determining the inductance L comprises the step of:

developing an indication of the inductance L in accordance with the relationship $$L \alpha \frac{1}{v_D} \bigg|_{i=0}$$

5. The method defined in claims 1 or 4 wherein said network current has a damped, substantially sinusoidal waveform.

6. The method defined in claim 5 wherein said network current is established by:

charging a capacitance to a predetermined voltage; and, thereafter coupling said capacitance in circuit with said network.

7. The method defined in claim 6, further comprising the steps of decoupling said capacitance from said network when said network voltage reaches the reference voltage $V_L$.

8. A method for monitoring the proximity of a target object to a sensor unit wherein the sensor unit includes a sensor inductor whose inductance $L_S$ varies in a known relationship with the proximity of the target object, the sensor unit also having a temperature-dependent or otherwise variable equivalent resistance in series with said inductance $L_S$ and a temperature-dependent or otherwise variable equivalent capacitance in shunt with said inductance $L_S$, comprising the steps of:

periodically establishing, during each of successive system periods $T_S$, a current $i_S$ through the sensor unit, and thereby through the sensor inductor, said sensor current having a time-variable waveform; and, for each such system period $T_S$, thereafter constraining the voltage $v_S$ across the sensor unit to be constant when said sensor voltage reaches a reference voltage $V_L$, whereby the effect of the equivalent capacitance is cancelled;

while so constraining said sensor voltage to be constant, determining the rate of change of said sensor current with respect to time when said sensor current is zero, whereby the effect of the equivalent resistance is cancelled;

establishing an indication of the inductance $L_S$ when said sensor current is zero in accordance with the relationship $$L_S \alpha \frac{1}{di_S/dt} \bigg|_{\substack{v_S = V_L \\ i_S = 0}}$$

and, providing a target proximity indication representative of the proximity of the target object to the sensor unit in accordance with a known relationship between the proximity of the target object and the inductance $L_S$.

9. The method defined in claim 8 wherein the step of constraining said sensor voltage comprises the steps of:

comparing said sensor voltage with the reference voltage $V_L$; and, when said sensor voltage reaches the reference voltage $V_L$, thereafter controlling said sensor current so as to maintain said sensor voltage at the reference voltage $V_L$.

10. The method defined in claim 9 wherein the step of determining the rate of change of said sensor current comprises the steps of:

developing a voltage $v_C$ which is proportionate to said sensor current; and, differentiating said voltage $v_C$ to obtain a voltage $v_D$ which is the analog of the rate of change of said voltage $v_C$, and thereby the analog of the rate of change of said sensor current.

11. The method defined in claim 10 wherein the step of providing a target proximity indication comprises the steps of:

comparing said voltage $v_D$ with a threshold actuation voltage which corresponds to a predetermined actuation gap between the target object and the sensor unit; and, providing a target-near indication when the target object is at or closer than the actuation gap in accordance with a known relationship between the proximity of the target object to the sensor unit and the inductance $L_S$, and in accordance with the relationship $$L_S \alpha \frac{1}{v_D} \bigg| i_s = 0$$

12. The method defined in claim 11, wherein, for successive system periods $T_S$, the duration and magnitude of successive target-near indications, as well as the occurrence or nonoccurrence of a given target-near indication, are randomly variable, the method further comprising, after the step of providing a target-near indication, the steps of:

integrating, over successive system periods $T_S$, respective target-near indications to obtain a time-average proximity voltage; p1 comparing the time-average proximity voltage with a predetermined threshold proximity voltage corresponding to a predetermined actuation gap between the target object and the sensor unit; and, providing a target proximity indication when said time-average proximity voltage reaches said threshold proximity voltage corresponding to the target object being at the actuation gap relative to the sensor unit.

13. The method defined in claim 11, wherein, for successive system periods $T_S$, the duration and magnitude of successive target-near indications, as well as the occurrence or nonoccurrence of target-near indications due to random noise, are randomly variable, the method further comprising, after the step of providing a target-near indication, the steps of:

quantizing each target-near indication to convert said target-near indication into a discrete quantum of electric charge, said quantum being substantially independent of the duration and magnitude of the target-near indication;

integrating, over successive system periods $T_S$, respective quanta to obtain a time-average proximity voltage;

comparing such time-average proximity voltage with a predetermined threshold proximity voltage corresponding to a predetermined actuation gap between the target object and the sensor unit; and, providing a target proximity indication when said time-average proximity voltage level reaches said threshold proximity voltage corresponding to the target object being at the actuation gap relative to the sensor unit.

14. The method defined in claims 9 or 12 wherein said sensor current has a damped, substantially sinusoidal waveform.

15. The method defined in claim 14 wherein said sensor current is established by periodically: charging a capacitance to a substantially constant voltage; and, thereafter coupling said capacitance in circuit with said sensor unit.

16. The method defined in claim 15, further comprising the step of periodically decoupling said capacitance from said sensor unit when said sensor voltage reaches the reference voltage $V_L$.

17. An inductance measuring apparatus for determining the inductance L of a network, wherein the network includes an equivalent resistance in series with the inductance L and an equivalent capacitance in shunt with the inductance L, said apparatus comprising:

current means for establishing a current i through the network, said network current having a time-variable waveform;

control loop means for thereafter constraining the voltage across said network to be constant when said network voltage reaches a reference voltage $V_L$ whereby the effect of the equivalent capacitance is cancelled;

retrieval means for determining, while said network voltage is so constrained to be constant, the rate of change of said network current with respect to time when said network current is zero, whereby the effect of the equivalent resistance is cancelled; and, measuring means for determining the inductance L in accordance with the relationship $$L = \frac{V_L}{\frac{di}{dt}} \bigg| i = 0$$

18. The inductance measuring apparatus defined in claim 17 wherein said control loop means comprises:

a control comparator responsive to the reference voltage $V_L$ and said network voltage to change its output when said network voltage reaches the reference voltage $V_L$; and, a current control circuit coupled to said network and being responsive to the change in the output of said control comparator to control said network current so as to maintain said network voltage at the reference voltage $V_L$.

19. The inductance measuring apparatus defined in claim 18 wherein said current control circuit comprises:

a feedback control circuit coupled between the output of and an input to said control comparator, said feedback control circuit being enabled by the change in the output of said control comparator;

said feedback control circuit, when enabled, conducting a feedback current which corresponds to said network current.

20. The inductance measuring apparatus defined in claim 19 further comprising:

current mirror means for providing a current which corresponds to said feedback current and, therefore, to said network current.

21. The inductance measuring apparatus defined in claim 19 wherein said retrieval means comprises:

current-to-voltage converter means for providing a voltage $v_C$ which is proportional to said feedback current and, therefore, to said network current;

differentiating means for differentiating said voltage $v_C$ to obtain a voltage $v_D$ which is the analog of the rate of change with respect to time of said voltage $v_C$ and, therefore, an analog of the rate of said network current.

22. The inductance measuring apparatus defined in claim 21 wherein said measuring means comprises:

calibration means for scaling the values of said voltage $v_D$ to predictable values of inductance; and, means responsive to said scaled voltage $v_D$ to determine the inductance L in accordance with the relationship $$L \alpha \frac{1}{v_D} \bigg|_{i=0}$$

23. The inductance measuring apparatus defined in claims 17 or 22 wherein said sensor current has a damped, substantially sinusoidal waveform.

24. The inductance measuring apparatus defined in claim 23 wherein said current means comprises:
   a network charging capacitor adapted to be coupled to said network;
   a current source to charge said network charging capacitor to a predetermined voltage $V_I$; and,
   switch means, coupled between said network charging capacitor and a ground reference potential, for effectively coupling said network charging capacitor across said network when said network charging capacitor is charged to the predetermined voltage $V_I$.

25. The inductance measuring apparatus defined in claim 24 wherein said switch means effectively decouples said network charging capacitor and said network when said network voltage reaches the reference voltage $V_L$.

26. A proximity sensing system for monitoring the proximity of a target object to a sensor unit wherein the sensor unit includes a sensor inductor whose inductance $L_S$ varies in a known relationship with the proximity of the target object, the sensor unit also having a temperature-dependent or otherwise variable equivalent resistance in series with said inductance $L_S$ and a temperature-dependent or otherwise variable and equivalent capacitance in shunt with said inductance $L_S$, the proximity sensing system comprising:
   current means for periodically establishing, during each of successive system periods $T_S$, a current $i_S$ through the sensor unit and, thereby, through the sensor inductor, said sensor current having a time-variable waveform;
   control loop means for thereafter constraining the voltage $v_S$ across said sensor unit to be constant when said sensor voltage reaches a reference voltage $V_L$, whereby the effect of the equivalent capacitance is cancelled;
   retrieval means for determining while said sensor voltage is so constrained to be constant, the rate of change of said sensor current with respect to time when said sensor current is zero (whereby the effect of the equivalent resistance is cancelled) so as to establish an indication of the inductance $L_S$ in accordance with the relationship $$L_S \alpha \frac{1}{di_S/dt} \bigg|_{\substack{v_S = V_L \\ i_S = 0}}$$

and,
   proximity determination means responsive to said inductance indication to provide a target proximity signal representative of the proximity of the target object to the sensor unit in accordance with the known relationship between the proximity of the target object and the inductance $L_S$.

27. The proximity sensing system defined in claim 26 wherein said sensor current has a damped, substantially sinusoidal waveform.

28. The proximity sensing system defined in claim 27 wherein said current means comprises:
   sensor current pulse means for impressing, during each system period $T_S$, a voltage across said sensor unit.

29. The proximity sensing system defined in claim 28 wherein said sensor current pulse means comprises:
   a sensor charging capacitor adapted to be coupled to said sensor unit;
   a current source operable to charge said sensor charging capacitor to a substantially constant charging voltage prior to each system period $T_S$; and,
   switch means, coupled between said sensor charging capacitor and a ground reference potential, for effectively coupling said sensor charging capacitor across said sensor unit when said sensor charging capacitor is charged to said charging voltage.

30. The proximity sensing system defined in claim 29 wherein said switch means effectively decouples said sensor charging capacitor and said sensor unit when said sensor voltage reaches said reference voltage $V_L$.

31. The proximity sensing system defined in claim 26 wherein said control loop means comprises:
   a control comparator responsive to the reference voltage $V_L$ and said sensor voltage to change its output when said sensor voltage reaches the reference voltage $V_L$; and,
   a current control circuit, coupled to said sensor unit, responsive to the change in the output of said control comparator to control said sensor current so as to maintain said sensor voltage at the reference voltage $V_L$.

32. The proximity sensing system defined in claim 31 wherein said current control circuit comprises:
   a feedback control circuit coupled between the output of and an input to said control comparator, said feedback control circuit being enabled by the change in the output of said comparator; and,
   said feedback control circuit, when enabled, conducting a feedback current which corresponds to said sensor current.

33. The proximity sensing system defined in claim 32 wherein said feedback control circuit comprises:
   a first solid state switch responsive to the change in the output of said control comparator to become conductive; and,
   a second solid state switch coupled to said network and being responsive to the conductive state of said first solid state switch to conduct said feedback current.

34. The proximity sensing system defined in claim 33 further comprising:
   current mirror means for providing a current which corresponds to said feedback current and, therefore, to said sensor current.

35. The proximity sensing system defined in claim 32 wherein said retrieval means comprises:
   current-to-voltage converter means for providing a voltage $v_C$ which is proportionate to said feedback current and, therefore, to said sensor current;
   differentiating means for differentiating said voltage $v_C$ to obtain a voltage $v_D$ which is the analog of the rate of change of such voltage $v_C$ and, therefore, an analog of the rate of change with respect to time of said sensor current; and, calibration means for scaling values of said voltage $v_D$ to predictable values of inductance so as to establish an indication of the inductance $L_S$ in accordance with the relationship $$L \alpha \frac{1}{v_D} \bigg|_{i=0}$$

36. The proximity sensing system defined in claim 35 wherein said retrieval means further includes:

buffer means for providing current isolation between said current-to-voltage converter means and said differentiating means, said voltage $v_C$ being coupled through said buffer means without distorting the waveform of said voltage $v_C$ at said current-to-voltage converter means.

37. The proximity sensing system defined in claim 36 wherein said proximity determination means comprises:

detecting means responsive to said voltage $v_D$ and to a threshold actuation voltage which corresponds to a predetermined actuation gap between the target object and the sensor unit, to provide a target-near detection signal when the target object is at the actuation gap.

38. The proximity sensing system defined in claim 37 wherein said detecting means comprises:

a detection comparator responsive to said voltage $v_D$ and to the threshold actuation voltage to change its output when said voltage $v_D$ corresponds to the threshold actuation voltage; and, gating means responsive to the change in the output of said detection comparator to provide a target-near detection pulse $P_D$.

39. The proximity sensing system defined in claim 38 wherein, for successive system periods $T_S$, the duration and magnitude of successive pulses $P_D$, as well as the occurrence or nonoccurrence of a given pulse $P_D$ due to random noise, are randomly variable, and wherein said proximity determination means further comprises:

an integrating circuit for integrating, over successive system period $T_S$, the pulses $P_D$ to obtain a time-average proximity voltage; and, a proximity switching circuit responsive to the time-average proximity voltage to output a target-near indication when such time-average proximity voltage corresponds to the target object being at the actuation gap relative to the sensor unit.

40. The proximity sensing system defined in claim 38 wherein said sensor current has a damped, substantially sinusoidal waveform.

41. The proximity sensing system defined in claim 40 wherein said current means comprises:

sensor current pulse means for impressing, during each system period $T_S$, a voltage across said sensor unit.

42. The proximity sensing system defined in claim 41 wherein said sensor current pulse means comprises:

a sensor charging capacitor adapted to be coupled to said sensor unit;

a current source operable to charge said sensor charging capacitor to a substantially constant charging voltage prior to each system period $T_S$; and, switch means, coupled between said sensor charging capacitor and a ground reference potential, for effectively coupling said sensor charging capacitor across said sensor unit when said sensor charging capacitor is charged to said charging voltage, thereby initiating a sensor charge period $T_C$.

43. The proximity sensing system defined in claim 42 wherein said switch means effectively decouples said charging capacitor and said sensor unit when said sensor voltage reaches said reference voltage $V_L$, thereby terminating the sensor charge period $T_C$.

44. The proximity sensing system defined in claim 43 wherein, for successive system periods $T_S$ the duration and magnitude of successive pulses $P_D$, as well as the occurrence or nonoccurrence due to random noise of a given pulse $P_D$, are randomly variable, and wherein said proximity determination means further comprises:

a quantizing circuit for converting each of said pulses $P_D$ into a discrete quantum of electric charge, said quantum being substantially independent of the duration and magnitude of said pulse $P_D$;

an integrating circuit for integrating, over successive system periods $T_S$, respective quanta to obtain a time-average proximity voltage; and, a proximity switching circuit responsive to said time-average proximity voltage to provide a target-near indication when said time-average proximity voltage corresponds to the target object being at the actuation gap relative to the sensor unit.

45. The proximity sensing system defined in claim 44 wherein said quantizing circuit comprises:

a bilevel circuit for providing either a high state or a low state output;

a first set switch responsive to said switch means to set, for each system period $T_S$, said bilevel circuit in its high state at a predetermined time between the initiation of said sensor charge period $T_C$ and the occurrence of a pulse $P_D$; and, a second set switch responsive to said gating means to switch said bilevel circuit to its low state at the time said pulse $P_D$ is initiated.

46. The proximity sensing system defined in claim 42 wherein said switch means operates at a random frequency so as to randomize the duration of successive system periods $T_S$.

* * * * *

UNITED STATES PATENT AND TRADEMARK OFFICE
CERTIFICATE OF CORRECTION

PATENT NO. : 4,219,740
DATED : August 26, 1980
INVENTOR(S) : William R. Little

It is certified that error appears in the above-identified patent and that said Letters Patent are hereby corrected as shown below:

Column 1 line 13: delete "as" insert --are--.

Column 5, line 47, Equation (1): delete $$"v_S = L_S \frac{di_L}{dt} + R_L i_L"$$

and insert $$--v_S = L_S \frac{di_L}{dt} + R_L i_L--$$

Column 6, line 12: delete "$di_s/dt$" and insert --$di_S/dt$.

Column 6, line 43: delete "actution" and insert --actuation--.

Column 6, line 64: delete "$v_s$" and insert --$v_S$.

Column 7, line 22, Equation (7): delete "$v_C = i_S R15'$" and insert --$v_C = i_S R15'$--.

Column 10, line 23: delete "a", first occurrence, and insert --at--.

UNITED STATES PATENT AND TRADEMARK OFFICE
CERTIFICATE OF CORRECTION

PATENT NO. : 4,219,740

DATED : August 26, 1980

INVENTOR(S) : William R. Little

It is certified that error appears in the above-identified patent and that said Letters Patent are hereby corrected as shown below:

Column 10, line 30: delete "abrupting" and insert --abruptly--.

Column 12, line 25: delete "$v_s$" and insert --$v_S$--.

Column 14, line 65, Equation (8): delete $$"L_S \; \alpha \; \frac{1}{\frac{di_s}{dt}} \; \alpha \; \frac{1}{\frac{dv_s}{dt}} \; \alpha \; \frac{1}{v_D} \; \bigg|  \; i_S = 0"$$

and insert $$--L_S \; \alpha \; \frac{1}{\frac{di_S}{dt}} \; \alpha \; \frac{1}{\frac{dv_S}{dt}} \; \alpha \; \frac{1}{v_D} \; \bigg| \; i_S = 0--$$

Column 15, line 12: delete "$V_D$ and insert --$v_D$--.

Column 15, line 65: delete arbitrarly and insert --arbitrarily--.

Column 21, line 57, Claim 4, line 1: delete "1" and insert --3--.

UNITED STATES PATENT AND TRADEMARK OFFICE
CERTIFICATE OF CORRECTION

PATENT NO. : 4,219,740

DATED : August 26, 1980

INVENTOR(S) : William R. Little

It is certified that error appears in the above-identified patent and that said Letters Patent are hereby corrected as shown below:

Column 23, line 14, Claim 11, line 10: delete $$"L_S \alpha \frac{1}{v_D} \bigg| i_S = 0"$$

and insert $$--L_S \alpha \frac{1}{v_D} \bigg| i_S = 0--$$

Column 23, line 25, Claim 12, line 10: delete "p1".

Column 23, line 25, Claim 12, line 10: start a new subparagraph with the word "comparing".

Signed and Sealed this

Twelfth Day of May 1981

[SEAL]

Attest:

RENE D. TEGTMEYER

Attesting Officer   Acting Commissioner of Patents and Trademarks